United States Patent
Leow et al.

(10) Patent No.: US 12,476,216 B2
(45) Date of Patent: Nov. 18, 2025

(54) WIRE BONDING FOR STACKED MEMORY DIES

(71) Applicant: Micron Technology, Inc., Boise, ID (US)

(72) Inventors: See Hiong Leow, Singapore (SG); Hong Wan Ng, Singapore (SG); Seng Kim Ye, Singapore (SG); Kelvin Aik Boo Tan, Singapore (SG); Ling Pan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 649 days.

(21) Appl. No.: 17/889,170

(22) Filed: Aug. 16, 2022

(65) Prior Publication Data

US 2024/0063168 A1     Feb. 22, 2024

(51) Int. Cl.
*H01L 23/00*     (2006.01)
*H10B 99/00*     (2023.01)

(52) U.S. Cl.
CPC ............. *H01L 24/48* (2013.01); *H10B 99/00* (2023.02); *H01L 2224/48105* (2013.01)

(58) Field of Classification Search
CPC ..... H01L 2224/8591; H01L 2224/8592; H01L 2224/859; H01L 2224/48105; H01L 2225/06506; H01L 25/0672; H01L 25/071; H01L 2924/386; H01L 2924/3861; H01L 2924/3862; H01L 24/49
See application file for complete search history.

(56) References Cited

U.S. PATENT DOCUMENTS

| | | | |
|---|---|---|---|
| 2016/0329303 A1* | 11/2016 | Ye | H01L 23/13 |
| 2020/0105709 A1* | 4/2020 | Low | H01L 24/48 |
| 2022/0189924 A1* | 6/2022 | Park | H01L 25/0657 |

\* cited by examiner

*Primary Examiner* — Davienne N Monbleau
*Assistant Examiner* — Emily Farmer
(74) *Attorney, Agent, or Firm* — Holland & Hart LLP

(57) ABSTRACT

Methods, systems, and devices for wire bonding for stacked memory dies are described. A memory system may include a stack of memory dies. As the stack grows to include more and more memory dies, the length of the wires coupling the memory dies with the control circuit may increase. Bonding multiple wires using an adhesive may increase a gap between neighboring wires coupled with the same memory die or different memory dies. For example, bonding one wire to a neighboring wire may pull one or both of the bonded wires away from their original placement, increasing a gap between the bonded wires and one or more neighboring wires. Bonding the wires coupled with a lower memory die may increase a gap such that sagging wires coupled with an upper memory die may be positioned in the gap to avoid shorting with the lower wires.

17 Claims, 8 Drawing Sheets

WIRE BONDING FOR STACKED MEMORY DIES

FIELD OF TECHNOLOGY

The following relates to one or more systems for memory, including wire bonding for stacked memory dies.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

To support operating a stack of memory dies, a memory system may include a control circuit that is coupled with each memory die via a respective set of wires, which may support the control circuit accessing each respective memory die. Including additional memory dies in the stack may increase a storage capacity of the memory system, among other benefits, however, as the stack grows to include more memory dies, the length of the wires coupling the memory dies to the control circuit may increase. Such increased wire length may lead to wire sagging (e.g., drooping, curving) due to an increase in slack or weight of the wire, such that wires of a higher memory die (e.g., a memory die located relatively further away from the substrate) may short to wires of a lower memory die (e.g., a memory die located relatively closer to the substrate).

DETAILED DESCRIPTION

A memory system may include a stack of memory dies (e.g., stacked on top of each other in a direction perpendicular to a substrate). To support operating the stack of memory dies, the memory system may include a control circuit that is coupled with each memory die via a respective set of wires (e.g., metal wires, such as copper wires, gold wires, among other types of wires), which may support the control circuit accessing each respective memory die. Including additional memory dies in the stack may increase a storage capacity of the memory system, among other benefits, however, as the stack grows to include more and more memory dies (e.g., more than eight memory dies, or some other quantity of memory dies), the length of the wires coupling the memory dies to the control circuit may increase (e.g., to reach one or more upper memory dies of the stack). Such increased wire length may lead to wire sagging (e.g., drooping, curving) due to an increase in slack or weight of the wire, such that wires of a higher memory die (e.g., a memory die located relatively further away from the substrate) may short to wires of a lower memory die (e.g., a memory die located relatively closer to the substrate).

In accordance with examples described herein, an adhesive (e.g., a glue, a non-conductive glue, an epoxy) may be used to bond multiple wires together. This bonding may increase a gap (e.g., a space, a distance) between neighboring wires coupled with the same memory die or with different memory dies. For example, bonding one wire to a neighboring (e.g., adjacent) wire may pull one or both of the bonded wires away from their original placement, increasing a gap on either side. Bonding two or more neighboring wires together using the adhesive to create or increase a gap between the wires will decrease the chance of shorting. For example, bonding the wires coupled with a lower memory die may increase a gap such that one or more sagging wires coupled with an upper memory die may be positioned in the gap, thereby avoiding contact and shorting of the one or more sagging wires with the bonded wires coupled with the lower memory die. Additionally or alternatively, neighboring wires coupled with the same memory die may be initially positioned (e.g., formed) close enough to each other to risk shorting together, and bonding one or more of the neighboring wires with one or more other wires may adjust the initial position to increase a gap between the neighboring wires to reduce the likelihood of shorting. As stacked memory dies may increase wire usage and crowding, bonding wires will prevent destructive contact or shorting between wires of respective memory dies.

Figure 1:
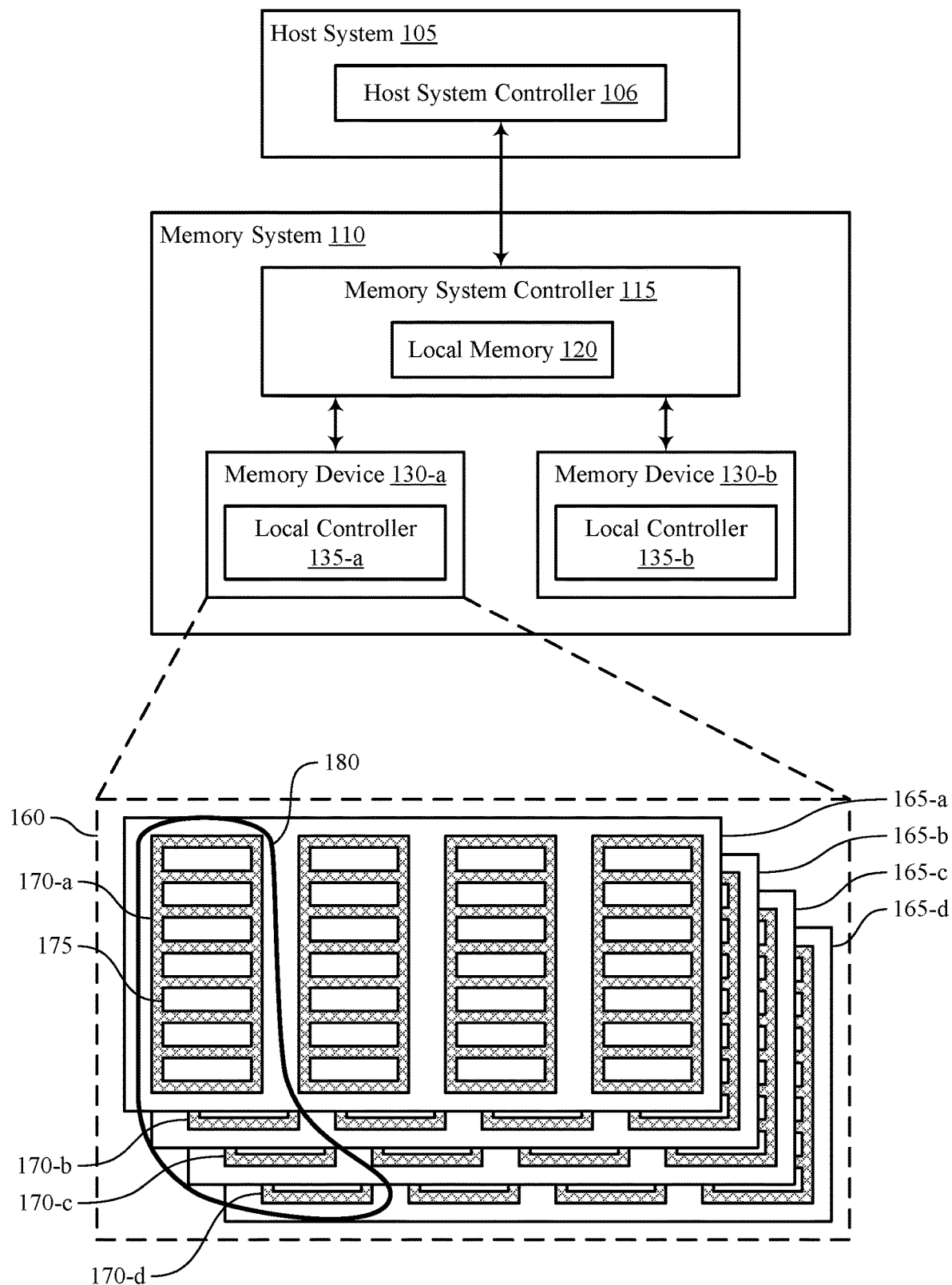
FIG. 1 illustrates an example of a system that supports wire bonding for stacked memory dies in accordance with examples as disclosed herein.

Features of the disclosure are initially described in the context of systems, devices, and circuits with reference to FIG. 1. Features of the disclosure are described in the context of memory structures with reference to FIGS. 2 through 6. These and other features of the disclosure are further illustrated by and described in the context of an apparatus diagram and flowchart that relate to wire bonding for stacked memory dies with reference to FIGS. 7 through 8.

FIG. 1 illustrates an example of a system 100 that supports wire bonding for stacked memory dies in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some examples, the memory system 110 may include multiple memory die that are stacked in a direction perpendicular to a substrate over which the memory system 110 is located. For example, to scale (e.g., increase) a storage capacity of the memory system 110, the memory system 110 may include a stack of memory dies. To operate the memory dies of the stack, respective sets of wires may couple the memory dies with a control circuit located over the substrate (e.g., formed in part by doping portions of the substrate). As memory dies are added to the stack, lengths of wires used to couple upper memory dies with the control circuit may increase, which may result in wire sagging, for example, due to an increase in slack or weight of the wire. In some cases, a wire may sag such that it contacts a wire used to couple a lower memory die with the control circuit, thereby shorting the wires together.

To reduce or eliminate the shorting of wires used to couple the memory dies of the stack with the control circuit, the multiple wires may be bonded together using an adhesive to increase a gap between neighboring wires. For example, wires coupled with a lower memory die may be bonded together by the adhesive, and one or more sagging wires coupled with an upper memory die may be positioned (e.g., routed, located) in the gap created by the bonding to avoid shorting between the upper and lower wires. In some examples, the adhesive may be a non-conductive adhesive such that the wires bonded together remain electrically isolated from each other (e.g., are not shorted together by the adhesive).

The system 100 may include any quantity of non-transitory computer readable media that support wire bonding for stacked memory dies. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

Figure 2:
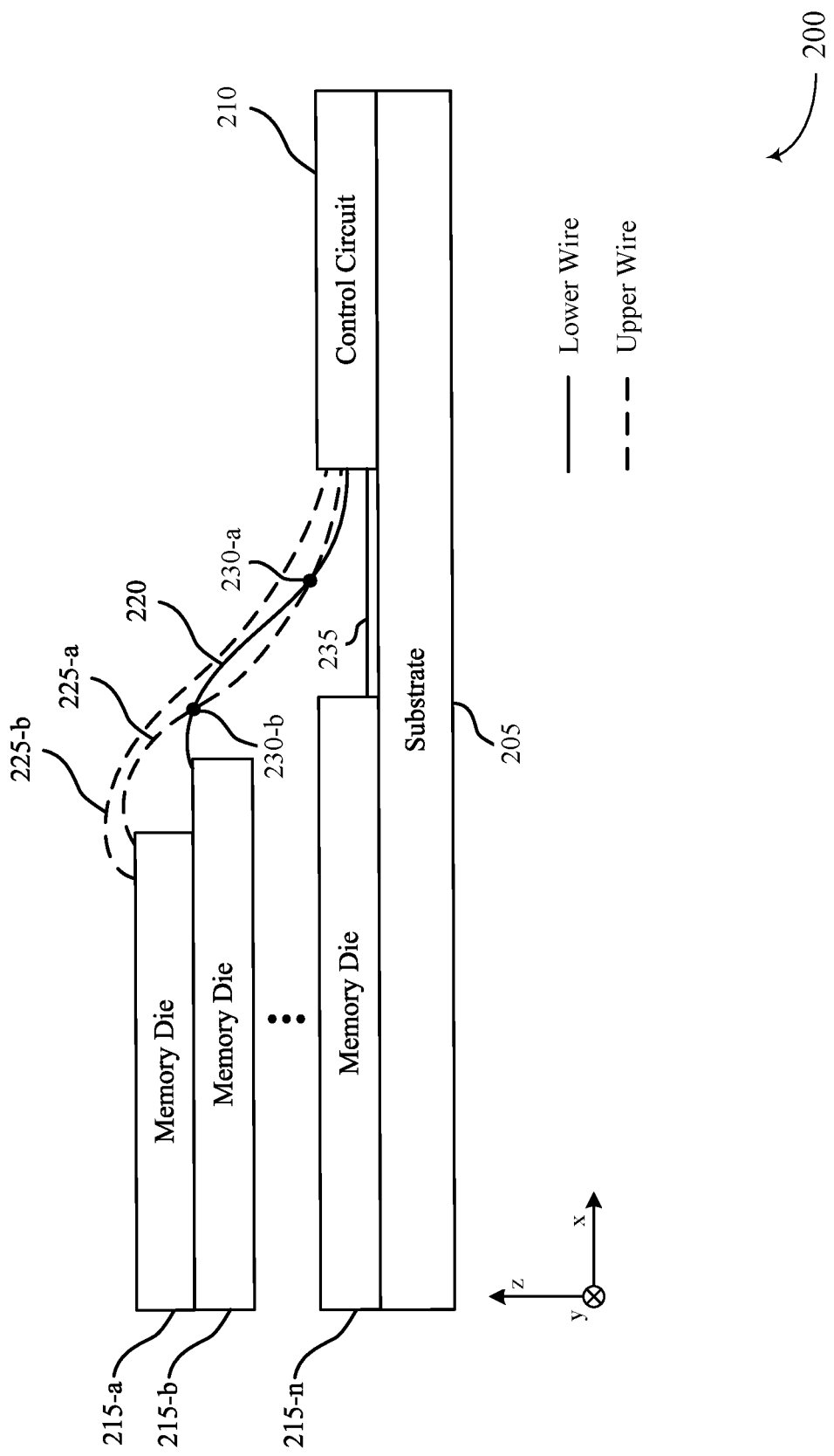
FIGS. 2, 3, 4, 5, 6 illustrates examples of layouts that support wire bonding for stacked memory dies in accordance with examples as disclosed herein.

FIG. 2 illustrates an example of a layout 200 that supports wire bonding for stacked memory dies in accordance with examples as disclosed herein. The layout 200 may be an example of or implement aspects of the memory system 110 as described with reference to FIG. 1. In some examples, the layout 200 may be referred to as a memory device or an electronic memory apparatus.

The layout 200 may include any quantity of memory dies 215 stacked over a substrate 205, and each memory die 215 may be associated with a respective level (e.g. tier, deck, layer) in the z-direction (e.g., a direction perpendicular to the substrate 205). For example, the layout 200 may include a memory die 215-a through 215-n that are each stacked on top of each other in the z-direction. In some examples, the substrate 205 may be a semiconductor wafer or other substrate over which a components of the layout 300 are formed.

Additionally, the layout 200 may include a control circuit 210. In some examples, the control circuit may be over the substrate 205 in the z-direction. In some examples, the control circuit may at least in part be substrate-based, such as including transistors formed at least in part by a doped portion of the substrate 205 (e.g., transistors configured in a complementary metal-oxide semiconductor (CMOS) arrangement). The control circuit 210 may be coupled with the memory dies 215 with (e.g., using, via) respective sets of wires. For example, the control circuit 210 may be coupled with the memory die 215-a via a set of wires 225 (e.g., wires 225-a and 225-b), a memory die 215-b via a set of wires 220 (e.g., a wire 220), and so on up to the memory die 215-n via a set of wires 235 (e.g., a wire 235). The memory die 215-a may be referred to as an upper memory die relative to the memory dies 215 beneath the memory die 215-a in the z-direction (e.g., closer to the substrate 205), the memory die 215-b may be referred to as a lower memory die relative to the memory die 215-a and an upper memory die relative to the memory dies 215 beneath the memory die 215-b in the z-direction, and so on. In some cases, the control circuit 210 may be configured to operate the memory dies 215 through the coupling. For example, the control circuit 210 may access the memory dies, perform read operations, perform write operations, communicate signaling with the memory dies (e.g., ground signaling, voltage signaling, chip select signaling, data signaling, among other types of signaling), and the like. In some examples, the control circuit 210 may be an example of or include aspects of a memory system controller 115.

As the memory dies 215 stack in the z-direction, the respective wires may increase in length. For example, the wires coupling the control circuit 210 with the upper memory die 215-a (e.g., wires 225-a and 225-b) may be longer than the wires coupling the control circuit 210 with the lower memory dies 215-b through 215-n (e.g., wire 220, wires 235, etc.), due to the relative distance between the control circuit 210 and each memory die 215. In some cases, the increase in wire length may result in sagging (e.g., drooping, curving, bending) wires due to an increase in slack or weight. Sagging wires may result in shorts between wires at different levels. For example, a portion of upper wire 225-a may sag such that it contacts the lower wire 220 and may short with lower wire 220 at one or more points of contact 230 (e.g., point of contact 230-a, 230-b, or both). Thus, to avoid destructive contact or shorting, the quantity of memory dies 215 in the stack of memory dies 215 may be constrained to limit wire length such that shorting due to wire sagging is avoided. However, constraining the quantity of memory dies 215 may also limit a storage capacity of the layout 200 (e.g., reduce the storage capacity relative to if additional memory dies 215 were included in the stack).

To support proper function (e.g., avoid wire shorting) while utilizing relatively large stacks of memory dies 215 (e.g., eight or more memory dies), space (e.g., gaps) may be created to position sagging upper wires between neighboring lower wires. For example, multiple wires 220 coupled with the lower memory die 215-b may be bonded together with an adhesive (e.g., a non-conductive glue, a conductive glue, among other adhesives or materials that may bond wires together). The bonding may increase a gap (e.g., a space or a distance) between the bonded wires 220 and other neighboring wires 220 coupled with the lower memory die 215. For example, bonding wire 220 to a first neighboring wire 220 (e.g., an adjacent wire 220 in the y-direction) may pull wire 220 away from its original placement, increasing the gap in the y-direction between wire 220 and a second neighboring wire 220. In some cases, the increased gap may be located such that the sagging upper wire 225-a may be positioned in the gap. Therefore, the increased gap may prevent destructive contact or shorting between the sagging wire 225-a and the lower wire 220, thereby supporting the memory die 215-a (e.g., among other memory dies 215) to be included in the stack of memory dies 215. As a result, storage capacity of the layout 200 may be increased while still supporting proper function and coupling with the control circuit 210.

Although FIG. 2 and the techniques described herein are described with reference to stacked memory dies, in some examples, the wire bonding techniques described herein, will be implemented by or are applicable to other types of stacked integrated circuits. For example, wire bonding will be implemented by or applicable to any type of stacked integrated circuit coupled with any type of circuitry of a substrate.

Figure 3:
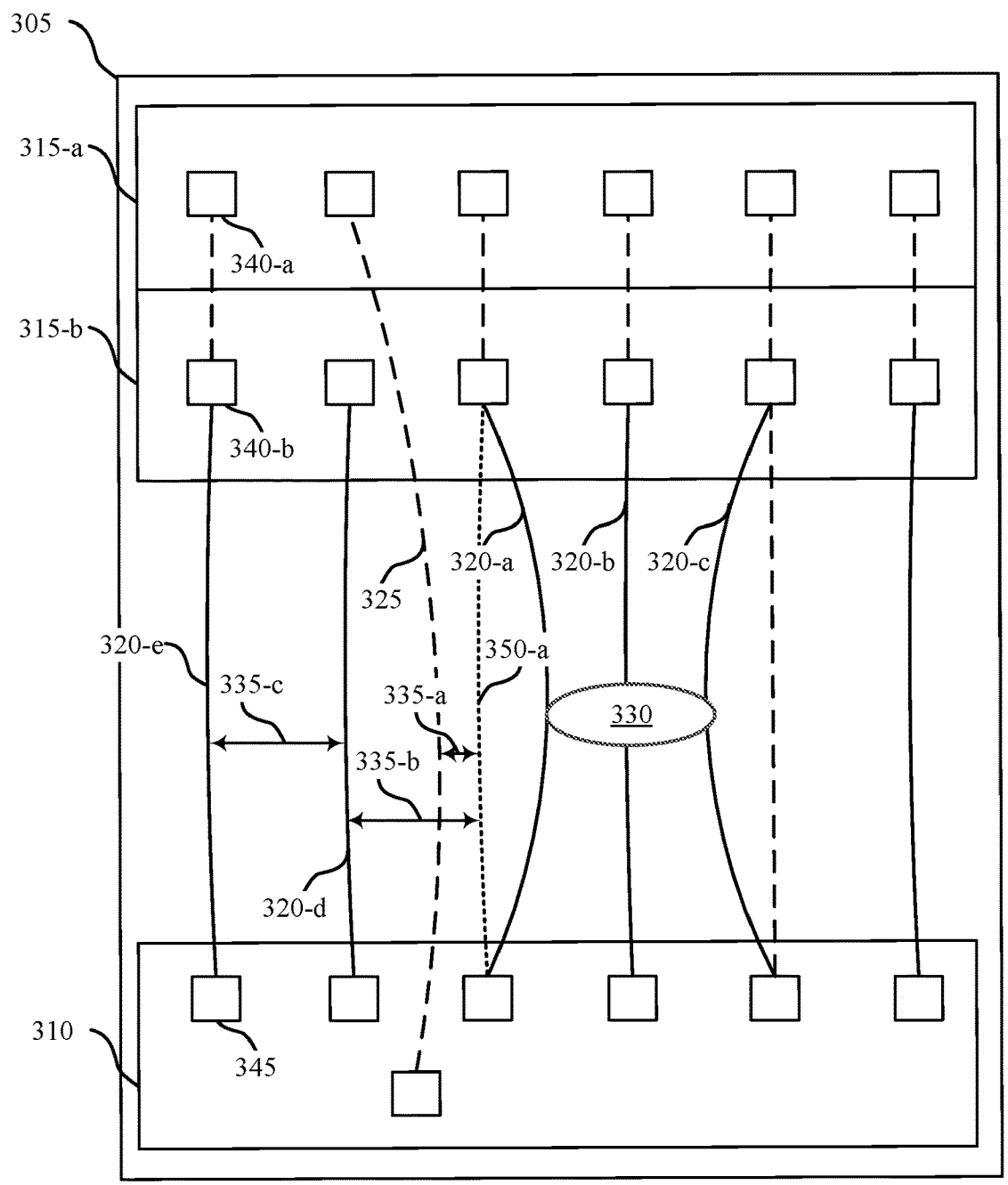

FIG. 3 illustrates an example of a layout 300 that supports wire bonding for stacked memory dies in accordance with examples as disclosed herein. The layout 300 may be an example of or implement aspects of the memory system 110 or layout 200 as described with reference to FIGS. 1 and 2, respectively.

A manufacturing system, such as a semiconductor fabrication system, may form the layout 300. For example, the manufacturing system may form a substrate 305, form a control circuit 310 over the substrate 305 (e.g., and/or based on doping one or more portions of the substrate 305), and form a stack of memory dies 315 over the substrate 305. For example, a lower memory die 315-b may be formed over the substrate 305 (e.g., and one or more other memory dies 315 between the lower memory die 315-b and the substrate 305), and an upper memory die 315-a may be formed over the substrate 305 and the lower memory die 315-b in the z-direction (e.g., perpendicular to the substrate 305). In the example of FIG. 3, the stack of memory dies 315 is illustrated as including two memory dies 315, for clarity, however, additional memory dies 315 above and/or below the memory dies 315-a and 315-b may be included in the stack of memory dies 315.

Each memory die 315 may include one or more respective pads 340 (e.g., pins). For example, memory die 315-a may include one or more pads 340-a and memory die 315-b may include one or more pads 340-b for coupling wires with other components of the memory dies 315, such as memory devices 130, memory system controllers 115, and the like. Additionally, the control circuit 310 may include one or more pads (e.g., pins) 345. Each of the one or more pads 345 of control circuit 310 may be coupled with a respective pad 340-a or 340-b of memory die 315-a or 315-b. For example, the manufacturing system may form wires 320 to couple each pad 340-b of memory die 315-b with a pad 345 and form wires 325 to couple a pad 340-a of memory die 315-a with a pad 345. In some examples, multiple wires 320 or 325 may be coupled with a same pad 345.

In some cases, the lengths of the wires 325 (e.g., to reach the upper memory die 315-a) relative to the lengths of the wires 320 may result in sagging. For example, extra slack or greater weight associated with an increased length of the wires 325 relative to the wires 320 may cause the wire 325 to sag or bend in the z-direction, such that a portion of the wire 325 is positioned near or in the same place as an original wire placement 350-a of wire 320-a (e.g., such that the wire 325 contacts the wire 320-a or would contact the wire 320-a if left in the original wire placement 350-a). In some cases, a distance 335-a (e.g., gap size, gap dimension, gap space, or the like) between and perpendicular to the sagging wire 325 and a wire 320 (e.g., 320-a) coupled with the lower memory die 315-b in the x-direction may fail to satisfy (e.g., be less than, less than or equal to) spacing parameters (e.g., a manufacturing or performance rule) of the layout 300. For example, the manufacturing system may determine that the distance 335-a (e.g., in the x-direction) between the sagging wire 325 and the original wire placement 350-a of wire 320-a may increase risk of shorting or unwanted contact. In some cases, the distance 335-a may be compared to a threshold distance. For example, the threshold distance may be at least twice the diameter (e.g., width) of a wire, and the manufacturing system may compare the distance 335-a to the threshold distance to determine whether the distance 335-a is less than or greater than the threshold distance. Other threshold distances may be possible, such as the diameter of a single wire, among others. It is noted that the wires 320 and 325 are depicted as lines, for clarity, and that the diameter of a wire in the x-direction may be greater than that depicted in FIG. 3.

In some cases, the manufacturing system may form the wire 325 after the spacing parameters are satisfied. For example, a distance 335-b between two wires 320 (e.g., between 320-a and 320-d) coupled with the lower memory die 315-b may fail to satisfy the spacing parameters. In some examples, the manufacturing system may determine that the distance 335-b fails to satisfy the spacing parameters after the wires 320-a and 320-d are formed (e.g., based on comparing the distance 335-b to the threshold distance). In some examples, it may be determined during a design phase for forming the layout 300 that the wires 320-a and 320-d will be formed such that the distance 335-b fails to satisfy the spacing parameters. In some cases, the manufacturing system may identify that the wire 325 will extend from the upper memory die 315-a to the control circuit 310 over the distance 335-b (e.g., above the space between wires 320-a and 320-d). Additionally, or alternatively, the manufacturing system may identify that the wire 325 may be a sagging wire (e.g., or that there is a relatively high likelihood that the wire 325 will sag based on a length of the wire 325). In some examples, the manufacturing system may identify that the wire 325 is a sagging wire based on determining that the wire 325 contacts the wire 320-a (e.g., are shorted together), for example, after the wire 325 is formed. The relatively small distance 335-b may increase the risk of shorting or unwanted contact between the wire 325 and one or both of the wires 320-a and 320-d. To decrease the risk of shorting or unwanted contact, increasing the distance 335-b may be desirable.

To increase the distances 335, two or more wires 320 coupled with the lower memory die 315-b may be bonded together by an adhesive 330. For example, the manufacturing system may bond wires 320-a, 320-b, and 320-c together with the adhesive 330. In some cases, bonding the wire may include the wires 320-a, 320-b, and 320-c being gathered and held (e.g., stuck) together by the adhesive 330, or in some cases, attached to one another using the adhesive 330. In some cases, the adhesive 330 may be a non-conductive glue, such that wires 320-a, 320-b, and 320-c are electrically isolated from each other. That is, the wires 320-a, 320-b, and 320-c may not be in contact with each other and may instead be physically separated from each other by at least a portion of the adhesive 330. Because the adhesive 330 may be non-conductive, the adhesive 330 may not couple the wires 320-a, 320-b, and 320-c together, and the wires 320-a, 320-b, and 320-c may remain electrically isolated (e.g., as before the wires 320-a, 320-b, and 320-c were bonded together). Alternatively, the adhesive 330 may be a conductive substance (e.g., glue, solder, metal, or the like), such that wires 320-a, 320-b, and 320-c are shorted together. In some examples, if the adhesive is conductive, the wires 320-a, 320-b, and 320-c may be configured to carry a same type of signal (e.g., ground) such that shorting of the wires 320-a, 320-b, 320-c may not cause errors.

In some cases, the adhesive 330 may be applied by an adhesive dispensing equipment. For example, the adhesive dispensing equipment may apply the adhesive 330 to one or more of the wires 320-a, 320-b, and 320-c. In some examples, the adhesive dispensing equipment may be a part of automated manufacturing equipment (e.g., a manufacturing system, a production line). Alternatively, the adhesive dispensing equipment may be used manually (e.g., a singular tool, handheld equipment, manually controlled equipment, etc.).

In some cases, the adhesive 330 may be applied before the wires 320 are gathered and held together. Alternatively, the wires 320 may be gathered and held close together, and the adhesive 330 may be applied directly to one or more locations where the wires 320 are held close together (e.g., one or more points of contact between the wires 320-a, 320-b, and 320-c) such that the adhesive 330 is applied to the wires 320. In some cases, the adhesive 330 may be applied to a specific portion or area of the one or more wires 320. For example, the adhesive dispensing equipment may apply the adhesive 330 to one or more of an upper portion, a middle portion, or a lower portion in the y-direction of the wires 320. That is, the adhesive 330 may be applied to the wires 320 at any point along the wires 320 in the y-direction (e.g., relatively closer to the pads 340, relatively closer to the pads 345). In some examples, the adhesive dispensing equipment may apply the adhesive 330 in between each of the wire bonds between the wires 320, for example, until the adhesive 330 bonds with the adjacent wires 320. For example, a first portion of adhesive 330 may be applied between wires 320-a and 320-b, and a second portion of adhesive 330 may be applied between wires 320-b and 320-c. Additionally or alternatively, the adhesive dispensing equipment may apply the adhesive across the wires 320 (e.g., across wires 320-a, 320-b, and 320-c when held together).

By bonding the wire 320-a to wires 320-b and 320-c, the wire 320-a may be pulled away (e.g., bent) from the original wire placement 350-a and additionally pulled away from the sagging wire 325. For example, the distance between the bonded wire 320-a and the sagging wire 325 (e.g., after bonding) is greater than the original distance 335-a (e.g., before bonding). Similarly, the distance between the bonded wire 320-a and the neighboring wire 320-d (e.g., after bonding) may be greater than the original distance 335-b (e.g., before bonding). In some cases, the new distances 335 may satisfy the spacing parameters or rules of the layout 300. For example, the manufacturing system may determine that the new distances between the sagging wire 325 and the wire 320-a, or between the wire 320-a and the wire 320-d, have reduced or removed the risk of shorting. Additionally, the distance 335 (e.g., a dimension of the gap in the x-direction after bonding) between the bonded wire 320-a and the wire 320-d may be greater than a distance 335-c (e.g., a dimension of a gap in the x-direction) between the wire 320-d and the wire 320-e based on the bonding. For example, the distances between the wire 320-d and the wires 320-a and 320-e may be equal (e.g., approximately equal) before bonding, but because the wire 320-a is bent away from the wire 320-d as part of the bonding, the distance 335-c may be less than (e.g., smaller than) the distance 335-b after bonding.

In some cases, once the wires 320-a, 320-b, and 320-c are bonded together, and the spacing parameters are satisfied, the manufacturing system may form the wire 325 to couple the control circuit 310 with the upper memory die 315-a. For example, the wire 325 may be positioned to extend from the upper memory die 315-a to the control circuit 310 at least partially over (e.g., above) or through the increased distance between wires 320-a and 320-d, such that even if the wire 325 sags to a level of the wires 320 in the z-direction, the wire 325 may not contact or be shorted with the wire 320-a. In some other cases, the manufacturing system may determine that the wire 325 and the wire 320-a are shorted together and may bond the wire 320-a together with one or more other wires 320 (e.g., the wires 320-b and 320-c) using the adhesive 330 to adjust the position of the wire 320-a such that the wire 325 and the wire 320-a are no longer shorted together.

By bonding wires 320 together using (e.g., with) the adhesive 330, wire shorting associated with sagging of wires used to couple upper memory dies 315 with the control circuit 310 may be reduced or eliminated. As a result, additional memory dies 315 may be included in the stack of memory dies 315, for example, to increase a storage capacity of the layout 300 (e.g., a device that implements that layout 300) while supporting proper operation and access of each of the memory dies 315.

Figure 4:
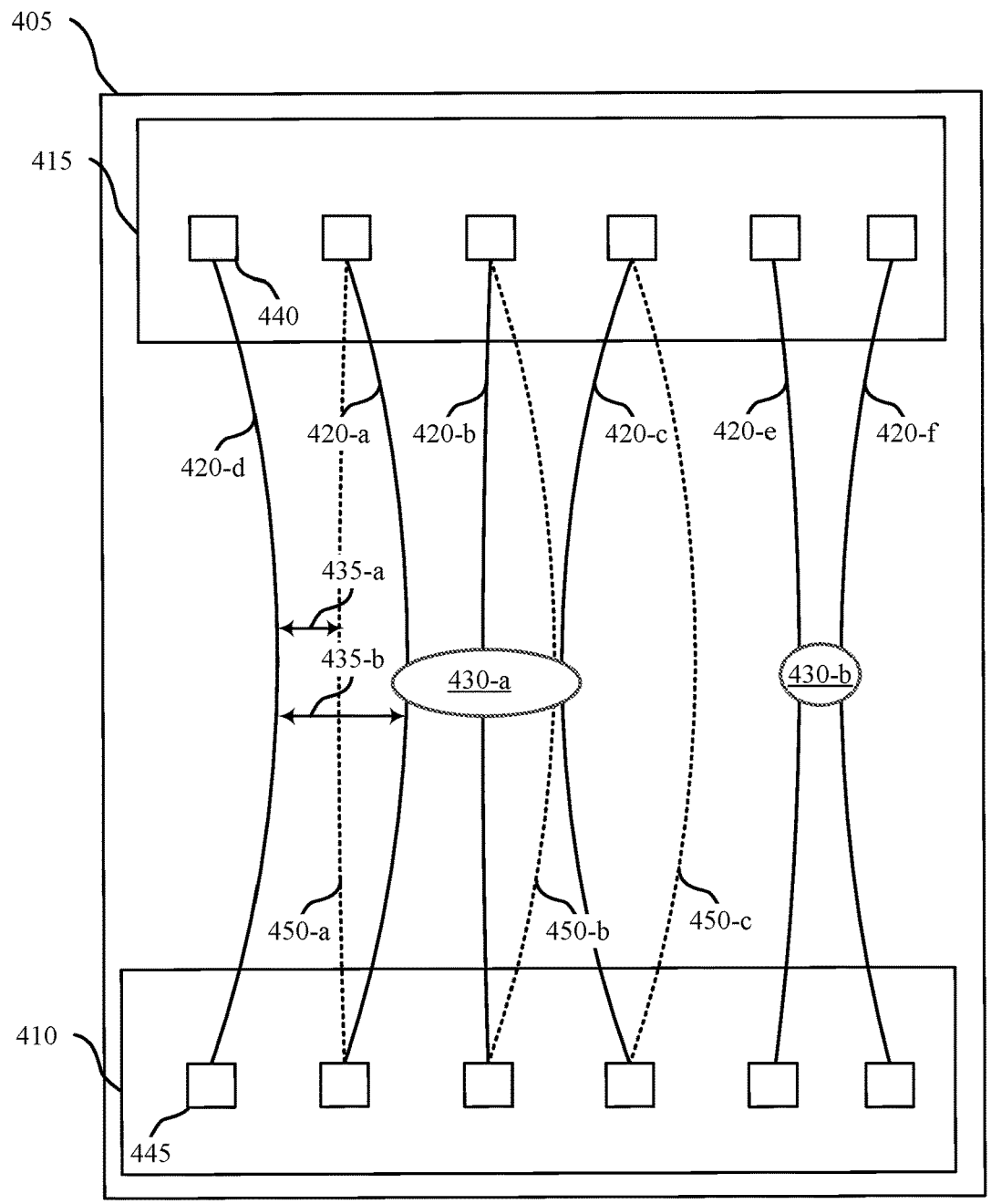

FIG. 4 illustrates an example of a layout 400 that supports wire bonding for stacked memory dies in accordance with examples as disclosed herein. The layout 400 may be an example of or implement aspects of the memory system 110, layout 200, or layout 300 as described with reference to FIGS. 1 through 3, respectively.

A manufacturing system may form the layout 400. For example, the manufacturing system may form a substrate 405, form a control circuit 410 over the substrate 405 (e.g., and/or based on doping one or more portions of the substrate 305), and form a stack of memory dies over the substrate 405 that includes the memory die 415. The memory die 415 may include one or more pads 440 (e.g., pads 340) for coupling wires 420 with other components of the memory die 415. Additionally, the control circuit 310 may include one or more pads 445 (e.g., pads 345). Each of the one or more pads 445 of control circuit 310 may be coupled with a respective pad 440 of the memory die 415. For example, the manufacturing system may form wires 420 to couple each pad 440 of memory die 415 with a pad 445 of the control circuit 410. In some cases, the memory die 415 may be an upper memory die, a lower memory die, or the only memory die of the stack of memory dies. In some examples, multiple wires 420 may be coupled with a same pad 445.

In some cases, the length of the wires 420 may result in sagging. For example, extra slack weight associated with the length of the wires 420 may cause the wires 420 to bend, for example, such that one or more of the wires 420 are positioned near each other. Additionally or alternatively, the wires 420 may be initially formed near each other, for example, due to various tolerances associated with forming the wires 420. A portion of a wire 420-d may be positioned near an original wire placement 450-a of a wire 420-a. In some cases, a distance 435-a (e.g., gap size, gap dimension, gap space, or the like) between the wire 420-d and the original wire placement 450-a of wire 420-a may fail to satisfy spacing parameters (e.g., a manufacturing or performance rule) of the layout 400. For example, the manufacturing system may determine that the distance 435-a between the wire 420-d and the original wire placement 450-a of wire 420-a in the x-direction (e.g., a direction parallel to the substrate 405) may be less than the spacing parameters such that risk of shorting or unwanted contact (e.g., between the wires 420-a and 420-d, between the wire 420-a and an upper wire, between the wire 420-d and an upper wire) is increased. For instance, the manufacturing system may compare the distance 435-a to a threshold distance and determine that the distance 435-a is less than (e.g., or equal to) the threshold distance. To decrease the risk of shorting or unwanted contact, increasing the distance 435-a may be desirable.

To increase the distance 435-a, the manufacturing system may bond two or more wires 420 together. For example, the manufacturing system may bond wires 420-a, 420-b, and 420-c together with an adhesive 430-a. Additionally, or alternatively, one or more other wires 420 may be bonded to wires 420-a, 420-b, and 420-c, or together as another set of bonded wires 420. For example, wires 420-e and 420-f may be bonded together by an adhesive 430-b. In some cases, bonding the wires 420 may include gathering the wires 420 and held together by the adhesive 430, or in some cases, attached to one another using the adhesive 430. In some cases, one or more of the adhesives 430 may be non-conductive adhesives, such that bonded wires 420 (e.g., wires 420-a, 420-b, and 420-c, wires 420-e and 420-f, or both) are electrically isolated from each other. Additionally or alternatively, one or more of the adhesives 430 may be a conductive substance, such that bonded wires 420 are shorted together. For example, if each of the wires 420-a, 420-b, and 420-c are connected to the same type of pads 440 and 445 (e.g., ground pads, voltage pads) the adhesive 430 may be conductive (e.g., or a non-conductive adhesive may still be used). Additionally, or alternatively, if each of the wires 420-a, 420-b, and 420-c are configured to carry the same type of information or signal (e.g., a ground signal) from the control circuit 410, the adhesive may be conductive (e.g., or a non-conductive adhesive may still be used).

In some cases, the adhesive 430 may be applied by an adhesive dispensing equipment (e.g., an automated manufacturing system, manual dispensing equipment). In some cases, the adhesive 430 may be applied before the wires 420 are gathered and held together. Alternatively, the wires 420 may be gathered and held together, and the adhesive 430 may be applied directly to one or more locations where the wires 420 are held close together (e.g., one or more points of contact between the wires 420-a, 420-b, and 420-c) such that the adhesive 430 is applied to the wires 420. In some cases, the adhesive 430 may be applied to specific portions or areas of the wires 420 (e.g., upper portions, middle portions, lower portions of the wires 420 in the y-direction). In some examples, the adhesive dispensing equipment may apply the adhesive 430 in between each of the wires 420 or across the wires 420 (e.g., across wires 420-a, 420-b, and 420-c when held together).

By bonding the wire 420-a to wires 420-b and 420-c, the wire 420-a may be pulled away (e.g., bent) from the original wire placement 450-a and additionally pulled away from neighboring wire 420-d. Similarly, the wires 420-b and 420-c, respectively, may be pulled away from their original wire placements 450-b and 450-c. Due to the change in placement, the distance 435-b between the bonded wire 420-a and the neighboring wire 420-d (e.g., after bonding) is greater than the original distance 435-a (e.g., before bonding).

Additionally, or alternatively, by bonding the wires 420-a, 420-b, and 420-c together, a first subset of wires 420 may be parallel to each other (e.g., with respect to the y-direction) and a second subset of wires 420 may be non-parallel to each other and to the first subset of parallel wires 420. For example, before bonding, the wire 420-d may be parallel, with respect to the y-direction (e.g., in a direction that the wires 420 extend from the control circuit 410 to the memory die 415), to the original wire placements 450-b and 450-c of the wires 420-b and 420-c, respectively. After bonding, due to the change in placement of the wires 420-b and 420-c, the wires 420-b, 420-c, and 420-d may be non-parallel to each other with respect to the y-direction while one or more unbonded wires 420 may remain parallel to each other and to the wire 420-d.

In some cases, the new distance 435-b may satisfy the spacing parameters or rules of the layout 400. For example, the manufacturing system may determine that the new distance 435-b between the wire 420-a and the wire 420-d has reduced or removed the risk of shorting. In some cases, the bonding process may be repeated on one or more wires of other memory dies 415 (e.g., an upper memory die or a lower memory die). In some cases, wires coupled with an upper memory die may be positioned (e.g., routed, formed, located) in the space between a set of bonded wires 420 and a neighboring wire 420 such that wire sagging may occur without shorting to the bonded wires 420. In some examples, wires 420 may be bonded together such that a placement of one or more of the bonded wires 420 is located (e.g., adjusted to be) in a space between bonded wires and a neighboring wire that are coupled with a lower memory die, for example, to avoid shorting between a wire 420 and a lower wire.

Figure 5:
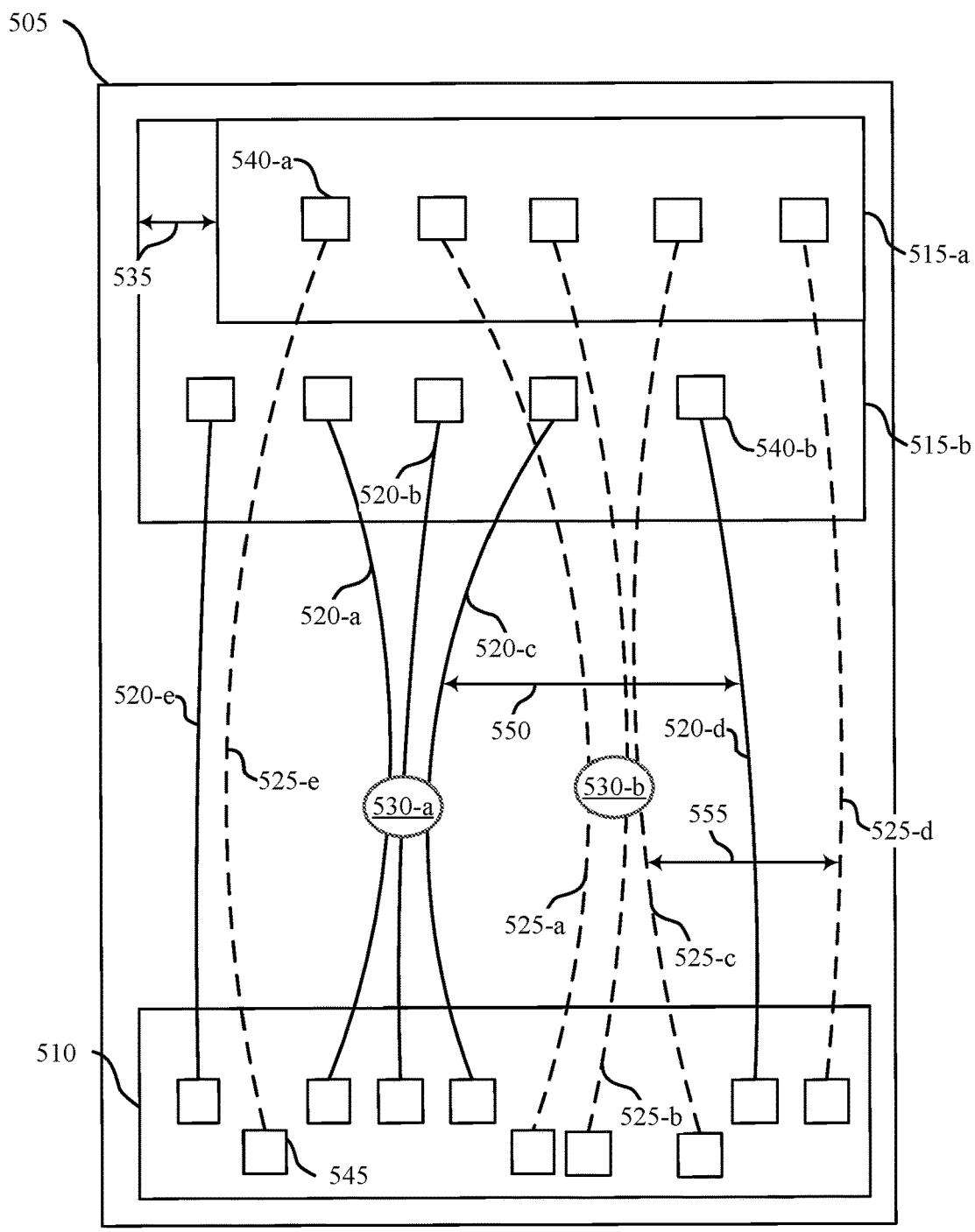

FIG. 5 illustrates an example of a layout 500 that supports wire bonding for stacked memory dies in accordance with examples as disclosed herein. The layout 500 may be an example of or implement aspects of the memory system 110, layout 200, layout 300, or layout 400 as described with reference to FIGS. 1 through 4, respectively.

A manufacturing system may form the layout 500. For example, the manufacturing system may form a substrate 505, form a control circuit 510 (e.g., over the substrate 505), and form a stack of memory dies 515 over the substrate 505. For example, a lower memory die 515-b may be formed over the substrate 505 (e.g., and one or more other memory dies 515 between the lower memory die 515-b and the substrate 505), and an upper memory die 515-a may be formed over the substrate 505 and the lower memory die 515-b (e.g., although the stack of memory dies 515 may include any quantity of memory dies 515). In some cases, the stack of memory dies 515 may be formed with an offset 535 in the x-direction. For example, in the example of FIG. 5, the upper memory die 515-a may be formed such that an edge of the upper memory die 515-a is not aligned with an edge of the lower memory die 515-b and may instead be offset from the edge of the lower memory die 515-b in the x-direction by the offset 535. In some other examples, the memory dies 515 without such an offset in the x-direction.

The memory dies 515 may include one or more pads 540 (e.g., pads 340 440). For example, memory die 515-a may include one or more pads 540-a, and memory die 515-b may include one or more pads 540-b. Additionally, the control circuit 510 may include one or more pads 545 (e.g., pads 345, 445). Each of the one or more pads 545 of control circuit 510 may be coupled with a respective pad 540 of memory die 515. For example, the manufacturing system may form wires 520 to couple each pad 540-b of memory die 515-b with a pad 545 of the control circuit 510. Additionally, the manufacturing system may form wires 525 to couple each pad 540-a of memory die 515-a with a pad 545 of the control circuit 510. In some examples, multiple wires 520 or 525 may be coupled with a same pad 545.

In some cases, the length of the wires 520, 525, or both may result in sagging. For example, a wire 525 from the upper memory die 515-a may sag in the z-direction, such that it is positioned near one or more wires 520 coupled with the lower memory die 515-b. In these cases, a distance (e.g., gap size, gap dimension, gap space, or the like) between the sagging wire 525 and a wire 520 coupled with the lower memory die 515-b may fail to satisfy spacing parameters (e.g., a manufacturing or performance rule) of the layout 500. For example, the manufacturing system may determine that the distance between the sagging wire 525 and one or more wires 520 may increase risk of shorting or unwanted contact. Additionally or alternatively, a wire 525 may sag such that it contacts a wire 520 coupled with the lower memory die 515-b such that the wire 525 and the wire 520 are shorted together.

Additionally, or alternatively, a wire 525 from the upper memory die 515-a, a wire 520 from the lower memory die 515-b, or both, may sag in the x-direction or be formed such that the given wire 520 or 525 is positioned near a neighboring wire of the same memory die 515. In these cases, a distance between the sagging wire and the neighboring wire of the same memory die 515 (e.g., between two wires 520 or between two wires 525) may not satisfy spacing parameters of the layout 500.

To increase the distance between at-risk (e.g., or shorted) wires, the manufacturing system may bond one or more wires together. For example, the manufacturing system may bond wires 520-*a*, 520-*b*, and 520-*c* coupled with the lower memory die 515-*b* together with the adhesive 530-*a* (e.g., although any quantity of wires 520 may be bonded together). Additionally, or alternatively, the manufacturing system may bond wires 525-*a*, 525-*b*, and 525-*c* coupled with the upper memory die 515-*a* together with the adhesive 530-*b* (e.g., although any quantity of wires 525 may be bonded together). In some cases, one or more other wires 520 may be bonded to wires 520-*a*, 520-*b*, and 520-*c*, or to another set of wires 520. Additionally, or alternatively, one or more other wires 525 may be bonded to wires 525-*a*, 525-*b*, and 525-*c*, or to another set of wires 525. In some cases, each set of wires coupled with each memory die 515 (e.g., at each level) may include one or more sets of bonded wires.

In some cases, the adhesive 530 may be applied by an adhesive dispensing equipment (e.g., an automated manufacturing system, manual dispensing equipment). In some cases, the adhesive 530 may be applied before the wires 520 or wires 525 are gathered and held together. Alternatively, the wires 520 or wires 525 may be gathered and held together, and the adhesive 530 may be applied directly to one or more locations where the wires 520 or wires 525 are held close together (e.g., one or more points of contact between the wires 520-*a*, 520-*b*, and 520-*c* or the wires 525-*a*, 525-*b*, 525-*c*) such that the adhesive 530 is applied to the wires 520 or wires 525. In some cases, the adhesive 530 may be applied to specific portions or areas of the wires 520 or wires 525 (e.g., upper portions, middle portions, lower portions of the wires 520 or wires 525 in the y-direction). In some examples, the adhesive dispensing equipment may apply the adhesive 530 in between each of the wires 520 or wires 525 or across the wires 520 or wires 525 (e.g., across wires 520-*a*, 520-*b*, and 520-*c*, across wires 525-*a*, 525-*b*, 525-*c*).

Bonding wires at memory die 515-*a*, 515-*b*, or both may pull one or more wires away from their original placements to increase the distance between one or more wires or sets of wires. For example, bonding the wires 520-*a*, 520-*b*, and 520-*c* together may create or increase a gap 550 on either side of the bonded wires 520 at the lower memory die 515-*b* (e.g., a gap between wire 520-*a* and a wires 520-*e*, a gap between wire 520-*c* and a wire 520-*d*). Additionally, or alternatively, bonding the wires 525-*a*, 525-*b*, and 525-*c* together may create or increase a gap 555 on either side of the bonded wires at upper memory die 515-*a* (e.g., a gap between wire 525-*a* and a wire 525-*e*, a gap between wire 525-*c* and a wire 525-*d*). In some examples, one or more wires 525 may be located in the gaps 550 between the bonded wires 520 and the neighboring wires 520. For example, the wire 525-*e* may be located at least partially in a gap 550 between the bonded wires 520 and the wire 520-*e*. Additionally, or alternatively, the bonded wires 525 may be located at least partially in a gap 550 between the bonded wires 520 and the wire 520-*d*. In some examples, one or more of the bonded wires 525 may be located in the gap 550 between the bonded wires 520 and the wire 520-*a* based on being bonded together. For example, an original placement of the wire 525-*a* may be adjusted based on the bonding using the adhesive 530-*b* such that the wire 525-*a* is located in the gap 550 between the bonded wires 520 and the wire 520-*a*.

In some cases, the increasing these gaps may satisfy the spacing parameters or rules of the layout 500. Put another way, the manufacturing system may determine that one or more of the gaps increased by bonding at the lower memory die 515-*b*, the upper memory die 515-*a*, or both, has reduced or removed the risk of shorting between wires. For example, by increasing a gap 550 next to the bonded wires 520-*a*, 520-*b*, and 520-*c* at the lower memory die 515-*b*, there may be more space for the bonded wires 525-*a*, 525-*b*, and 525-*c* to extend from the control circuit 510 to the memory die 515-*a* without sagging (e.g., in the z-direction) near or to be in contact with the wire 520-*c*. In some cases, the bonded wires 525-*a*, 525-*b*, and 525-*c* may extend from the control circuit 510 to the memory die 515-*a* without sagging (e.g., in the z-direction) near the wire 520-*c* due to the offset 535. For example, the offset 535 between the upper memory die 515-*a* and the lower memory die 515-*b* may further offset the pads 540-*a* from the pads 540-*b* such that the bonded wires 525 may extend over (e.g., in, through) the gap 550 between the bonded wires 520 and the wire 520-*d*.

Additionally, or alternatively, by increasing a gap next to the bonded wires 520-*a*, 520-*b*, and 520-*c* at the lower memory die 515-*b*, there may be more space for neighboring wires 520 to extend from the control circuit 510 to the lower memory die 515-*b* without sagging (e.g., in the x-direction) near or to be in contact with the wires 520-*a* or 520-*c*. Likewise, by increasing a gap next to the bonded wires 525-*a*, 525-*b*, and 525-*c* at the upper memory die 515-*a*, there may be more space for neighboring wires 525 to extend from the control circuit 510 to the upper memory die 515-*a* without sagging (e.g., in the x-direction) near or to be in contact with the wires 525-*a* or 525-*c*.

In some cases, the bonding process may be repeated on one or more wires of one or more additional memory dies 515 (e.g., a third memory die at a third level, or the like).

Figure 6:
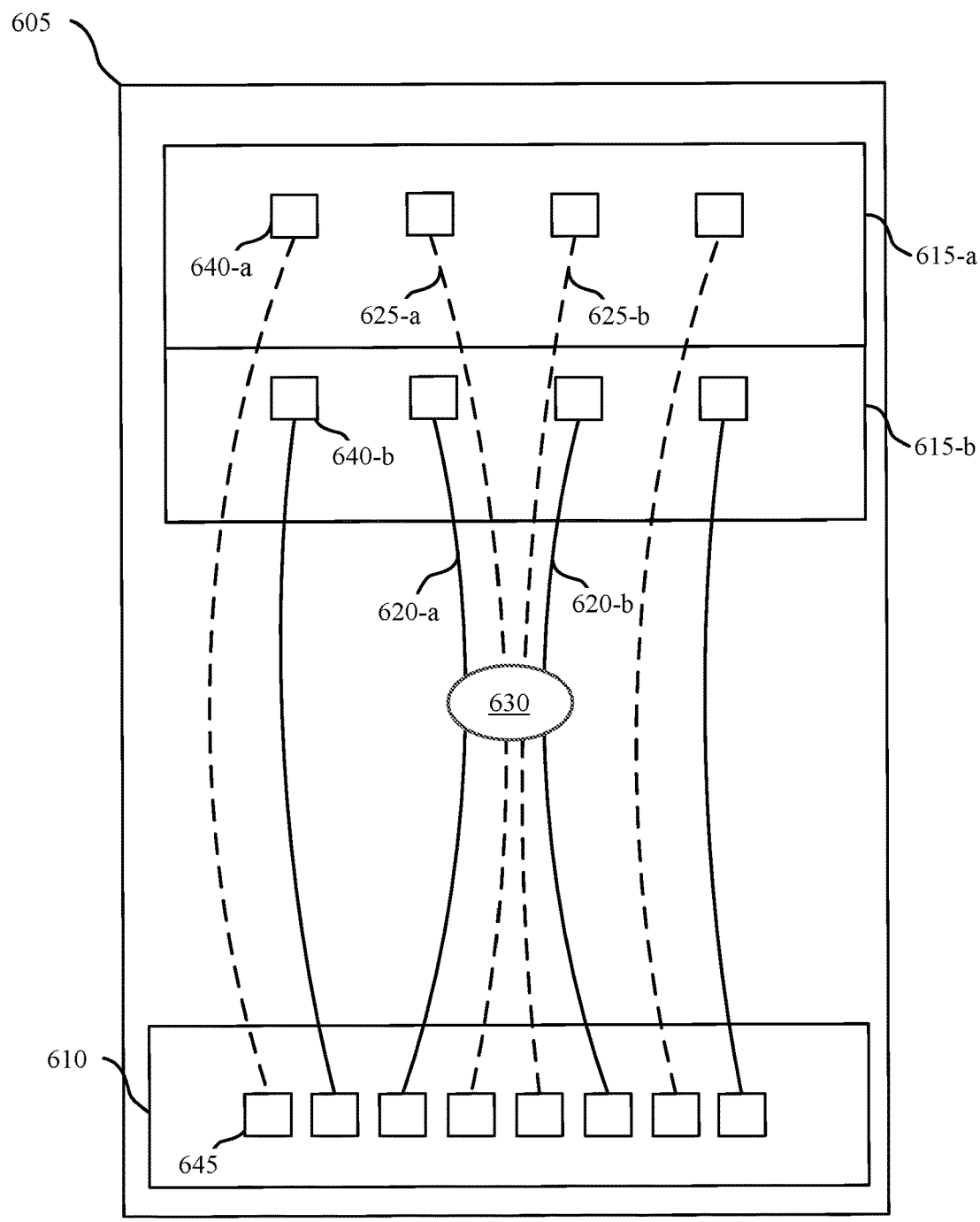

FIG. 6 illustrates an example of a layout 600 that supports wire bonding for stacked memory dies in accordance with examples as disclosed herein. The layout 600 may be an example of or implement aspects of the memory system 110, layout 200, layout 300, layout 400, or layout 500 as described with reference to FIGS. 1 through 5, respectively.

A manufacturing system may form the layout 600. For example, the manufacturing system may form a substrate 605, form a control circuit 610 (e.g., over the substrate 605), and form a stack of memory dies 615 over the substrate 605. For example, a lower memory die 615-*b* may be formed over the substrate 605 (e.g., and one or more other memory dies 515 between the lower memory die 615-*b* and the substrate 605), and an upper memory die 615-*a* may be formed over the substrate 605 and the lower memory die 615-*b* (e.g., although the stack of memory dies 615 may include any quantity of memory dies 615).

The memory dies 615 may include one or more pads 640 (e.g., pads 340, 440, 540). For example, memory die 615-*a* may include one or more pads 640-*a* and memory die 615-*b* may include one or more pads 640-*b*. Additionally, the control circuit 610 may include one or more pads 645 (e.g., pads 345, 445, 545). Each of the one or more pads 645 of control circuit 610 may be coupled with a respective pad 640 of memory die 615. For example, the manufacturing system may form wires 620 to couple each pad 640-*b* of memory die 615-*b* with a pad 645 of the control circuit 610. Additionally, the manufacturing system may form wires 625 to couple each pad 640-*a* of memory die 615-*a* with a pad 645 of the control circuit 610. In some examples, multiple wires 620 or 625 may be coupled with a same pad 645.

In some cases, the length of the wires 620, 625, or both may result in sagging. For example, a wire 625 from the upper memory die 615-*a* may sag in the z-direction, such that it is positioned near one or more wires 620 coupled with the lower memory die. In these cases, a distance (e.g., gap size, gap dimension, gap space, or the like) between the sagging wire 625 and a wire 620 coupled with the lower memory die 615-*b* may fail to satisfy spacing parameters (e.g., a manufacturing or performance rule) of the layout 600. For example, the manufacturing system may determine that the distance between the sagging wire 625 and one or more wires 620 may increase risk of shorting or unwanted contact. Additionally or alternatively, a wire 625 may sag such that it contacts a wire 620 coupled with the lower memory die 615-*b* such that the wire 625 and the wire 620 are shorted together.

Additionally, or alternatively, a wire 625 from the upper memory die 615-*a*, a wire 620 from the lower memory die 615-*b*, or both, may sag in the x-direction or be formed, such that the given wire 620 or 625 is positioned near a neighboring wire of the same memory die 615. In these cases, a distance between the sagging wire and the neighboring wire of the same memory die 615 (e.g., between two wires 620 or between two wires 625) may not satisfy spacing parameters of the layout 600.

To increase the distance between at-risk (e.g., or shorted) wires, the manufacturing system may bond one or more wires together. For example, the manufacturing system may bond wires 620-*a* and 620-*b* coupled with the lower memory die 615-*b* and wires 625-*a* and 625-*b* coupled with the upper memory die 615-*a* together with an adhesive 630 (e.g., although any quantity of wires 620 and wires 625 may be bonded together using the adhesive 630). In some cases, one or more other wires 620 or 625 may be bonded to wires 620-*a*, 620-*b*, 625-*a*, and 625-*b* or to another set of wires 620, wires 625, or both.

In some cases, the adhesive 630 may be applied by an adhesive dispensing equipment (e.g., an automated manufacturing system, manual dispensing equipment). In some cases, the adhesive 630 may be applied before the wires 620 are gathered and held together. Alternatively, the wires 620 may be gathered and held together, and the adhesive 630 may be applied directly to one or more locations where the wires 620 are held close together (e.g., one or more points of contact between the wires 620-*a*, 620-*b*, and 620-*c*) such that the adhesive 630 is applied to the wires 620. In some cases, the adhesive 630 may be applied to specific portions or areas of the wires 620 (e.g., upper portions, middle portions, lower portions of the wires 620 in the y-direction). In some examples, the adhesive dispensing equipment may apply the adhesive 630 in between each of the wires 620 or across the wires 620 (e.g., across wires 620-*a*, 620-*b*, 625-*a*, 625-*b*).

Bonding wires at memory die 615-*a*, 615-*b*, or both may pull one or more wires away from their original placements to increase the distance (e.g., gap, space) between one or more wires or sets of wires. In some cases, the increasing these gaps may satisfy the spacing parameters or rules of the layout 600. Put another way, the manufacturing system may determine that one or more of the gaps increased by bonding at the lower memory die 615-*b*, the upper memory die 615-*a*, or both, has reduced or removed the risk of shorting between wires. For example, bonding the wires 620-*a*, 620-*b*, 625-*a*, and 625-*b* together may create or increase a gap to on either side of the bonded wires such that wires from an additional level (e.g., above memory die 615-*a* and 615-*b*) may sag (e.g., in the z-direction) without unwanted contact or shorting.

Additionally, or alternatively, by increasing a gap next to the bonded wires 620-*a*, 620-*b*, 625-*a*, and 625-*b* at both memory dies 615, there may be more space for neighboring wires 620, 625, or both to extend from the control circuit 610 to the memory dies 615 without sagging (e.g., in the x-direction, in the z-direction) near or to be in contact with the bonded wires. In some cases, the bonding process may be repeated on one or more wires of one or more additional memory dies 615 (e.g., a third memory die at a third level, or the like). That is, one or more wires of the one or more additional memory dies 615 may be bonded together with the bonded wires 620-*a*, 620-*b*, 625-*a*, and 625-*b* using the adhesive 630.

Figure 7:
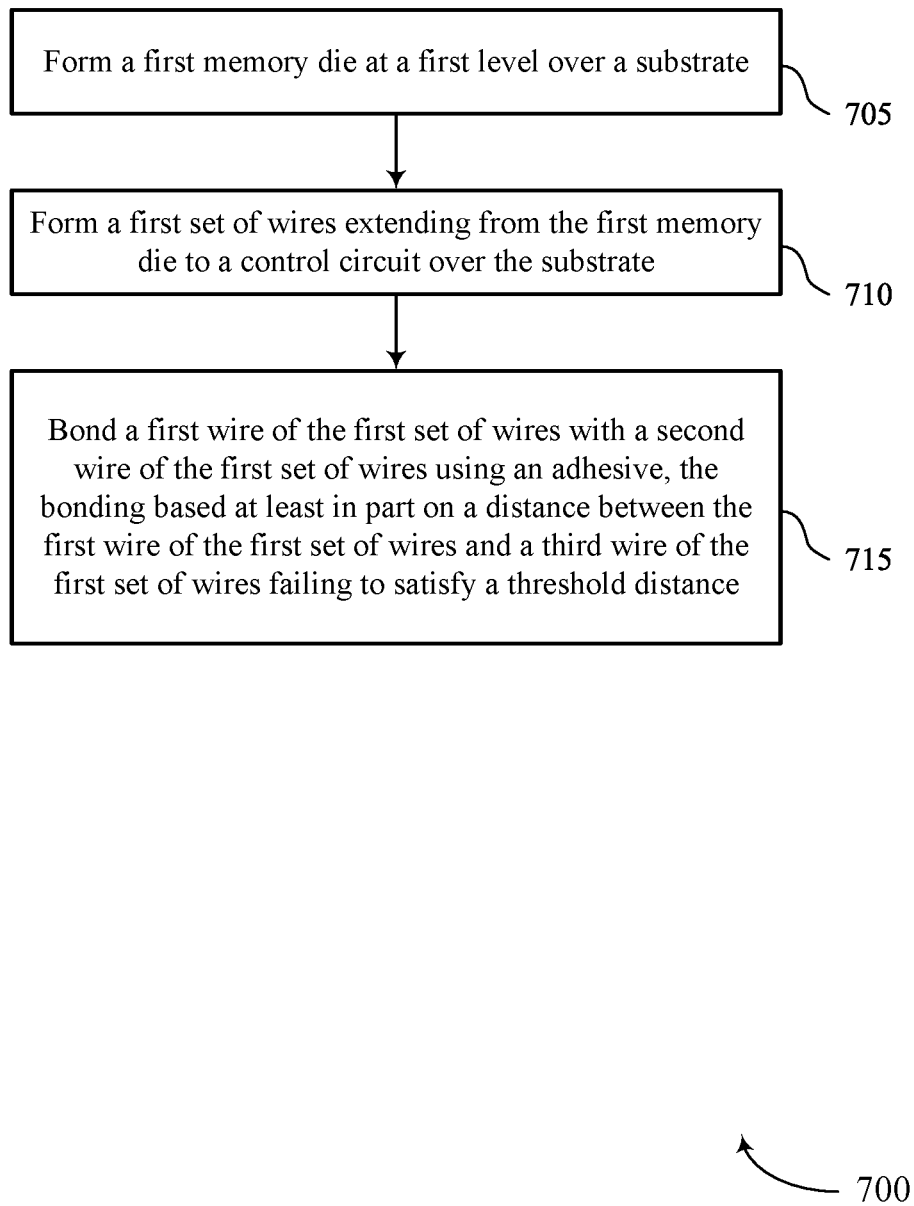
FIGS. 7 and 8 show flowcharts illustrating a method or methods that support wire bonding for stacked memory dies in accordance with examples as disclosed herein.

FIG. 7 shows a flowchart illustrating a method 700 that supports wire bonding for stacked memory dies in accordance with examples as disclosed herein. The operations of method 700 may be implemented by a manufacturing system or one or more controllers associated with a manufacturing system. In some examples, one or more controllers may execute a set of instructions to control one or more functional elements of the manufacturing system to perform the described functions. Additionally, or alternatively, the manufacturing system may perform aspects of the described functions using special-purpose hardware.

At 705, the method may include forming a first memory die at a first level over a substrate. The operations of 705 may be performed in accordance with examples as disclosed herein.

At 710, the method may include forming a first plurality of wires extending from the first memory die to a control circuit over the substrate. The operations of 710 may be performed in accordance with examples as disclosed herein.

At 715, the method may include bonding a first wire of the first plurality of wires with a second wire of the first plurality of wires using an adhesive, the bonding based at least in part on a distance between the first wire of the first plurality of wires and a third wire of the first plurality of wires failing to satisfy a threshold distance. The operations of 715 may be performed in accordance with examples as disclosed herein.

In some examples, an apparatus (e.g., a manufacturing system) as described herein may perform a method or methods, such as the method 700. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a first memory die at a first level over a substrate; forming a first plurality of wires extending from the first memory die to a control circuit over the substrate; and bonding a first wire of the first plurality of wires with a second wire of the first plurality of wires using an adhesive, the bonding based at least in part on a distance between the first wire of the first plurality of wires and a third wire of the first plurality of wires failing to satisfy a threshold distance.

Aspect 2: The method or apparatus of aspect 1, further including operations, features, circuitry, logic, means, or instructions, or any combination thereof for comparing the distance between the first wire of the first plurality of wires and the third wire of the first plurality of wires to the threshold distance, where bonding the first wire and the second wire is based at least in part on the comparison.

Aspect 3: The method or apparatus of any of aspects 1 through 2, where the threshold distance is equal to or greater than twice a width of a wire of the first plurality of wires.

Aspect 4: The method or apparatus of any of aspects 1 through 3, where bonding the first wire further includes operations, features, circuitry, logic, means, or instructions, or any combination thereof for bonding the first wire of the first plurality of wires with the second wire of the first plurality of wires using a non-conductive adhesive, where the first wire and the second wire are electrically isolated from each other.

Aspect 5: The method or apparatus of any of aspects 1 through 3, where bonding the first wire further includes operations, features, circuitry, logic, means, or instructions, or any combination thereof for bonding the first wire of the first plurality of wires with the second wire of the first plurality of wires using a conductive adhesive, where the first wire and the second wire are electrically shorted together.

Aspect 6: The method or apparatus of aspect 5, where the first wire and the second wire are configured to carry a same signal type.

Aspect 7: The method or apparatus of any of aspects 1 through 6, further including operations, features, circuitry, logic, means, or instructions, or any combination thereof for forming a second memory die at a second level over the first memory die and forming a second plurality of wires extending from the second memory die to the control circuit over the substrate.

Aspect 8: The method or apparatus of aspect 7, further including operations, features, circuitry, logic, means, or instructions, or any combination thereof for bonding a fourth wire of the second plurality of wires with a fifth wire of the second plurality of wires using a second adhesive, where the fourth wire of the second plurality of wires and the fifth wire of the second plurality of wires extend from the control circuit to the second memory die over the distance between the first wire of the first plurality of wires and the third wire of the first plurality of wires.

Aspect 9: The method or apparatus of any of aspects 7 through 8, further including operations, features, circuitry, logic, means, or instructions, or any combination thereof for bonding one or more wires of the first plurality of wires and one or more wires of the second plurality of wires together using the adhesive.

Figure 8:
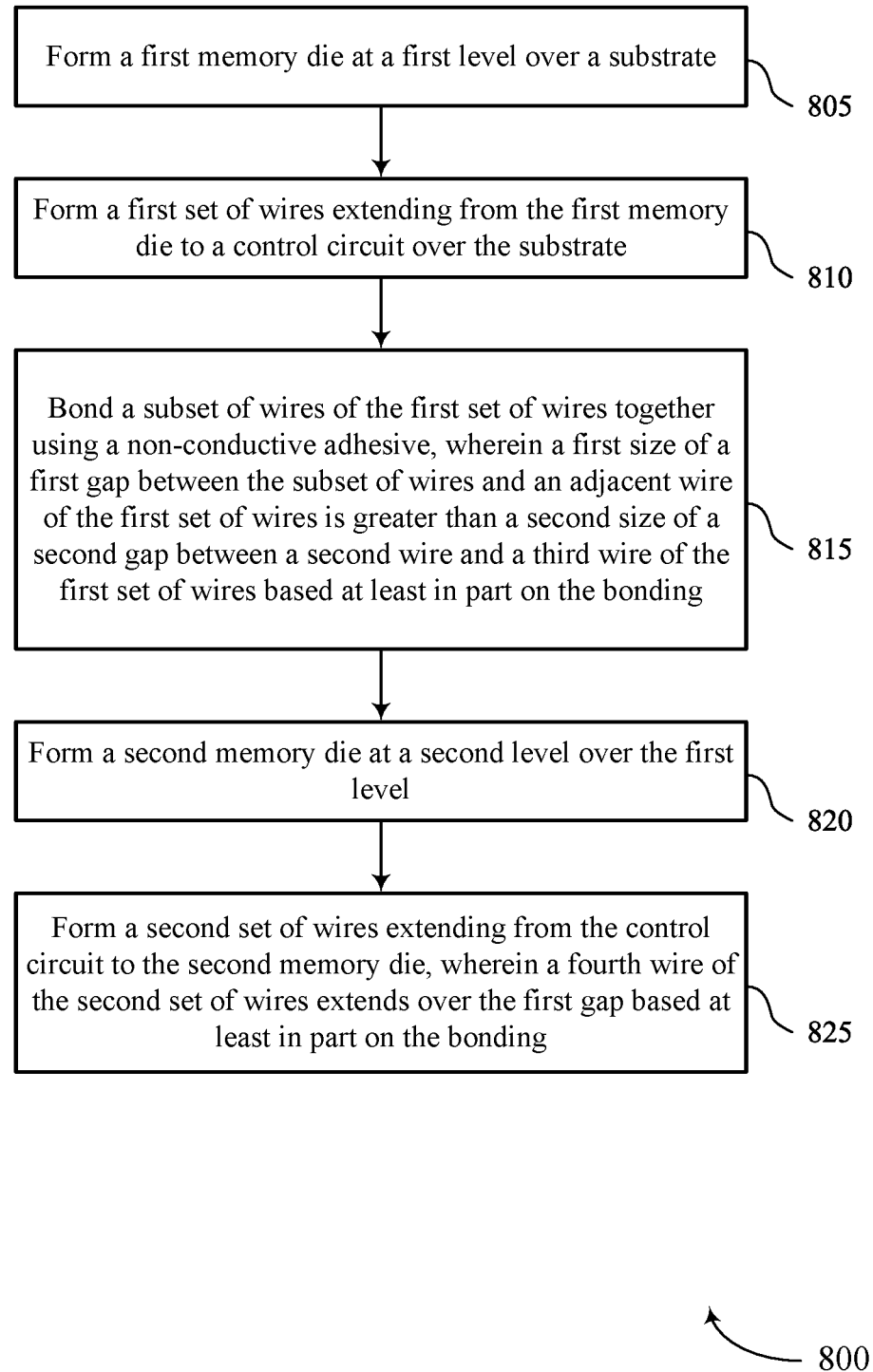

FIG. 8 shows a flowchart illustrating a method 800 that supports wire bonding for stacked memory dies in accordance with examples as disclosed herein. The operations of method 800 may be implemented by a manufacturing system or one or more controllers associated with a manufacturing system. In some examples, one or more controllers may execute a set of instructions to control one or more functional elements of the manufacturing system to perform the described functions. Additionally, or alternatively, the manufacturing system may perform aspects of the described functions using special-purpose hardware.

At 805, the method may include forming a first memory die at a first level over a substrate. The operations of 805 may be performed in accordance with examples as disclosed herein.

At 810, the method may include forming a first plurality of wires extending from the first memory die to a control circuit over the substrate. The operations of 810 may be performed in accordance with examples as disclosed herein.

At 815, the method may include bonding a subset of wires of the first plurality of wires together using a non-conductive adhesive, where a first size of a first gap between the subset of wires and an adjacent wire of the first plurality of wires is greater than a second size of a second gap between a second wire and a third wire of the first plurality of wires based at least in part on the bonding. The operations of 815 may be performed in accordance with examples as disclosed herein.

At 820, the method may include forming a second memory die at a second level over the first level. The operations of 820 may be performed in accordance with examples as disclosed herein.

At 825, the method may include forming a second plurality of wires extending from the control circuit to the second memory die, where a fourth wire of the second plurality of wires extends over the first gap based at least in part on the bonding. The operations of 825 may be performed in accordance with examples as disclosed herein.

In some examples, an apparatus (e.g., a manufacturing system) as described herein may perform a method or methods, such as the method 800. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 10: A method or apparatus including operations, features, circuitry, logic, means, or instructions, or any combination thereof for forming a first memory die at a first level over a substrate; forming a first plurality of wires extending from the first memory die to a control circuit over the substrate; bonding a subset of wires of the first plurality of wires together using a non-conductive adhesive, where a first size of a first gap between the subset of wires and an adjacent wire of the first plurality of wires is greater than a second size of a second gap between a second wire and a third wire of the first plurality of wires based at least in part on the bonding; forming a second memory die at a second level over the first level; and forming a second plurality of wires extending from the control circuit to the second memory die, where a fourth wire of the second plurality of wires extends over the first gap based at least in part on the bonding.

Aspect 11: The method or apparatus of aspect 10, where bonding the subset of wires further includes operations, features, circuitry, logic, means, or instructions, or any combination thereof for bonding the subset of wires together before forming the second memory die at the second level, the bonding based at least in part on an initial gap between the subset of wires and the adjacent wire failing to satisfy a threshold.

Aspect 12: The method or apparatus of aspect 10, where bonding the subset of wires further includes operations, features, circuitry, logic, means, or instructions, or any combination thereof for bonding the subset of wires together after forming the second memory die at the second level, the bonding based at least in part on an initial size of the first gap failing to satisfy a threshold, a third gap between the subset of wires and the fourth wire of the second plurality of wires failing to satisfy a threshold, or both.

Aspect 13: The method or apparatus of any of aspects 10 through 12, further including operations, features, circuitry, logic, means, or instructions, or any combination thereof for determining that the fourth wire of the second plurality of wires extends over a wire of the first plurality of wires, where bonding the subset of wires of the first plurality of wires together is based at least in part on the determining.

Aspect 14: The method or apparatus of any of aspects 10 through 13, further including operations, features, circuitry, logic, means, or instructions, or any combination thereof for determining, before bonding the subset of wires, an initial size of the first gap, where the initial size of the first gap is less than the first size of the first gap.

Aspect 15: The method or apparatus of aspect 14, where bonding the subset of wires of the first plurality of wires together is based at least in part on the initial size of the first gap failing to satisfy a threshold gap size.

Aspect 16: The method or apparatus of any of aspects 14 through 15, further including operations, features, circuitry, logic, means, or instructions, or any combination thereof for bonding a third subset of wires together using the non-conductive adhesive, the third subset of wires including one or more wires of the first plurality of wires and one or more wires of the second plurality of wires.

Aspect 17: The method or apparatus of aspect 16, further including operations, features, circuitry, logic, means, or instructions, or any combination thereof for bonding a second subset of wires of the second plurality of wires together using the non-conductive adhesive.

Aspect 18: The method or apparatus of aspect 17, where bonding the second subset of wires of the second plurality of wires together is based at least in part on the initial size of the first gap failing to satisfy a threshold gap size.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 19: An apparatus, including: a stack of memory dies over a substrate, the stack of memory dies including a first memory die at a first level and a second memory die at a second level; a control circuit over the substrate and configured to operate the first memory die and the second memory die; a first plurality of wires configured to couple the first memory die with the control circuit, the first plurality of wires including a subset of wires bonded together by an adhesive, where a dimension of a gap between the subset of wires and a first wire of the first plurality of wires is based at least in part on the subset of wires being bonded together; and a second plurality of wires configured to couple the second memory die with the control circuit, the second plurality of wires including a second wire extending from the control circuit to the second memory die at least partially over the gap.

Aspect 20: The apparatus of aspect 19, where the dimension of the gap between the subset of wires and the first wire extends in a first direction perpendicular to a second direction of the subset of wires and the first wire.

Aspect 21: The apparatus of any of aspects 19 through 20, where a portion of the second wire is located in the gap and between the subset of wires and the first wire based at least in part on the subset of wires being bonded together.

Aspect 22: The apparatus of any of aspects 19 through 21, further including: a second gap between a third wire and a fourth wire of the first plurality of wires, where a dimension of the second gap is smaller than the dimension of the gap between the subset of wires and the first wire of the first plurality of wires.

Aspect 23: The apparatus of any of aspects 19 through 22, where the adhesive includes a non-conductive adhesive and the subset of wires bonded together include a plurality of wires electrically isolated from each other based at least in part on the adhesive being non-conductive.

Aspect 24: The apparatus of any of aspects 19 through 22, where the adhesive includes a conductive adhesive and the subset of wires bonded together include a plurality of wires electrically shorted together other based at least in part on the adhesive being conductive.

Aspect 25: The apparatus of aspect 24, where each wire of the subset of wires bonded together are configured to carry a same type of signal.

Aspect 26: The apparatus of any of aspects 19 through 25, where the second plurality of wires includes a second subset of wires bonded together by a second adhesive, the second subset of wires including the second wire and extending from the control circuit to the second memory die at least partially over the gap.

Aspect 27: The apparatus of any of aspects 19 through 26, further including: a second subset of wires bonded together by the adhesive, the second subset of wires including one or more wires of the first plurality of wires and one or more wires of the second plurality of wires.

An apparatus is described. The following provides an overview of aspects of the apparatus as described herein:

Aspect 28: An apparatus, including: a stack of memory dies over a substrate; a control circuit over the substrate configured to operate one or more memory dies of the stack of memory dies; and a first plurality of wires configured to couple a first memory die with the control circuit, the first plurality of wires including one or more subsets of wires bonded together by a non-conductive adhesive, where the wires bonded together by the non-conductive adhesive are electrically isolated from each other, and where a distance between a first subset of wires and a second wire is based at least in part on the first subset of wires being bonded together by the non-conductive adhesive.

Aspect 29: The apparatus of aspect 28, where the distance between the first subset of wires and the second wire satisfies a threshold distance based at least in part on the first subset of wires being bonded together by the non-conductive adhesive.

Aspect 30: The apparatus of aspect 29, where the threshold distance is equal to or greater than twice a diameter of a wire of the first plurality of wires.

Aspect 31: The apparatus of any of aspects 28 through 30, further including: a second plurality of wires configured to couple a second memory die over the first memory die with the control circuit, where one or more wires of the second plurality of wires are located in a space between the first subset of wires and the second wire based at least in part on the first subset of wires being bonded together by the non-conductive adhesive.

Aspect 32: The apparatus of any of aspects 28 through 31, further including: a second plurality of wires configured to couple a second memory die over the first memory die with the control circuit, where a second subset of wires of the second plurality of wires are bonded together with the first subset of wires by the non-conductive adhesive.

An apparatus is described. The following provides an overview of aspects of the apparatus as described herein:

Aspect 33: An apparatus, including: a stack of memory dies over a substrate; a control circuit over the substrate configured to operate one or more memory dies of the stack of memory dies; and a plurality of wires configured to couple a first memory die of the stack of memory dies with the control circuit, where the plurality of wires includes: a first subset of wires extending from the control circuit to the first memory die in a first direction and that are parallel to each other with respect to the first direction; and a second subset of wires extending from the control circuit to the first memory die in the first direction, where one or more wires of the second subset are non-parallel to each other and to the wires of the first subset with respect to the first direction, where the one or more wires of the second subset are non-parallel based at least in part on the second subset of wires being bonded together by an adhesive.

Aspect 34: The apparatus of aspect 33, further including: a bend in the one or more wires of the second subset based at least in part on the second subset of wires being bonded together by the adhesive, where the one or more wires of the second subset are non-parallel based at least in part on the bend.

Aspect 35: The apparatus of any of aspects 33 through 34, further including: a second plurality of wires configured to couple a second memory die of the stack of memory dies with the control circuit, the second memory die over the first memory die, where the second plurality of wires are parallel to each other with respect to the first direction, and where a wire of the second plurality of wires extends over a gap between the first subset of parallel wires and the second subset of non-parallel wires.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer," "tier," "deck," or "level" used herein refers to a stratum or sheet of a geometrical structure (e.g., relative to a substrate). Each layer, tier, deck, or level may have three dimensions (e.g., height, width, and depth) and may cover at least a portion of a surface. For example, a layer, tier, deck, or level may be a three dimensional structure where two dimensions are greater than a third, e.g., a thin-film. Layers, tiers, decks, or levels may include different elements, components, or materials. In some examples, one layer, tier, deck, or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. An apparatus, comprising:
   a stack of memory dies over a substrate, the stack of memory dies comprising a first memory die at a first level and a second memory die at a second level;
   a control circuit over the substrate and configured to operate the first memory die and the second memory die;

a first plurality of wires configured to couple the first memory die with the control circuit, the first plurality of wires comprising a subset of wires bonded together by an adhesive, wherein a dimension of a gap between the subset of wires and a first wire of the first plurality of wires is based at least in part on the subset of wires being bonded together; and a second plurality of wires configured to couple the second memory die with the control circuit, the second plurality of wires comprising a second wire extending from the control circuit to the second memory die at least partially over the gap.

2. The apparatus of claim 1, wherein the dimension of the gap between the subset of wires and the first wire extends in a first direction perpendicular to a second direction of the subset of wires and the first wire.

3. The apparatus of claim 1, wherein a portion of the second wire is located in the gap and between the subset of wires and the first wire based at least in part on the subset of wires being bonded together.

4. The apparatus of claim 1, further comprising:
a second gap between a third wire and a fourth wire of the first plurality of wires, wherein a dimension of the second gap is smaller than the dimension of the gap between the subset of wires and the first wire of the first plurality of wires.

5. The apparatus of claim 1, wherein the adhesive comprises a non-conductive adhesive and the subset of wires bonded together comprise a plurality of wires electrically isolated from each other based at least in part on the adhesive being non-conductive.

6. The apparatus of claim 1, wherein the adhesive comprises a conductive adhesive and the subset of wires bonded together comprise a plurality of wires electrically shorted together other based at least in part on the adhesive being conductive.

7. The apparatus of claim 6, wherein each wire of the subset of wires bonded together are configured to carry a same type of signal.

8. The apparatus of claim 1, wherein the second plurality of wires comprises a second subset of wires bonded together by a second adhesive, the second subset of wires comprising the second wire and extending from the control circuit to the second memory die at least partially over the gap.

9. The apparatus of claim 1, further comprising:
a second subset of wires bonded together by the adhesive, the second subset of wires comprising one or more wires of the first plurality of wires and one or more wires of the second plurality of wires.

10. An apparatus, comprising:
a stack of memory dies over a substrate;
a control circuit over the substrate configured to operate one or more memory dies of the stack of memory dies; and
a first plurality of wires configured to couple a first memory die with the control circuit, the first plurality of wires comprising one or more subsets of wires bonded together by a non-conductive adhesive, wherein the one or more subsets of wires bonded together by the non-conductive adhesive are electrically isolated from each other, and wherein a distance between a first subset of wires and a second wire is based at least in part on the first subset of wires being bonded together by the non-conductive adhesive.

11. The apparatus of claim 10, wherein the distance between the first subset of wires and the second wire satisfies a threshold distance based at least in part on the first subset of wires being bonded together by the non-conductive adhesive.

12. The apparatus of claim 11, wherein the threshold distance is equal to or greater than twice a diameter of a wire of the first plurality of wires.

13. The apparatus of claim 10, further comprising:
a second plurality of wires configured to couple a second memory die over the first memory die with the control circuit, wherein one or more wires of the second plurality of wires are located in a space between the first subset of wires and the second wire based at least in part on the first subset of wires being bonded together by the non-conductive adhesive.

14. The apparatus of claim 10, further comprising:
a second plurality of wires configured to couple a second memory die over the first memory die with the control circuit, wherein a second subset of wires of the second plurality of wires are bonded together with the first subset of wires by the non-conductive adhesive.

15. An apparatus, comprising:
a stack of memory dies over a substrate;
a control circuit over the substrate configured to operate one or more memory dies of the stack of memory dies; and
a plurality of wires configured to couple a first memory die of the stack of memory dies with the control circuit, wherein the plurality of wires comprises:
a first subset of wires extending from the control circuit to the first memory die in a first direction and that are parallel to each other with respect to the first direction; and
a second subset of wires extending from the control circuit to the first memory die in the first direction, wherein one or more wires of the second subset are non-parallel to each other and to the wires of the first subset with respect to the first direction, wherein the one or more wires of the second subset are non-parallel based at least in part on the second subset of wires being bonded together by an adhesive.

16. The apparatus of claim 15, further comprising:
a bend in the one or more wires of the second subset based at least in part on the second subset of wires being bonded together by the adhesive, wherein the one or more wires of the second subset are non-parallel based at least in part on the bend.

17. The apparatus of claim 15, further comprising:
a second plurality of wires configured to couple a second memory die of the stack of memory dies with the control circuit, the second memory die over the first memory die, wherein the second plurality of wires are parallel to each other with respect to the first direction, and wherein a wire of the second plurality of wires extends over a gap between the first subset of parallel wires and the second subset of non-parallel wires.

* * * * *